(12) United States Patent
Baek et al.

(10) Patent No.: US 8,541,775 B2
(45) Date of Patent: Sep. 24, 2013

(54) SCHOTTKY DIODE, RESISTIVE MEMORY DEVICE HAVING SCHOTTKY DIODE AND METHOD OF MANUFACTURING THE SAME

(75) Inventors: Seung Beom Baek, Ichon-si (KR); Young Ho Lee, Ichon-si (KR); Jin Ku Lee, Ichon-si (KR); Mi Ri Lee, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 41 days.

(21) Appl. No.: 13/331,698

(22) Filed: Dec. 20, 2011

(65) Prior Publication Data
US 2012/0305876 A1 Dec. 6, 2012

(30) Foreign Application Priority Data
May 31, 2011 (KR) .................. 10-2011-0052435

(51) Int. Cl.
*H01L 21/02* (2006.01)

(52) U.S. Cl.
USPC ............... 257/30; 257/52; 257/379; 257/430; 257/595; 257/E27.016; 257/E27.102; 257/E29.257; 257/E29.001; 257/E31.048; 257/E45.002

(58) Field of Classification Search
USPC ............. 257/30, 52, 330–332, 379, 390, 430, 257/257/530, 595, 596, E27.016, 102, 103, 257/29.001, 257, 31.048, 49, 89, 129, 45.002
See application file for complete search history.

(56) References Cited

U.S. PATENT DOCUMENTS

| | | | | |
|---|---|---|---|---|
| 4,785,186 A * | 11/1988 | Street et al. | .............. | 250/370.14 |
| 5,496,763 A * | 3/1996 | Roesner | ......................... | 438/467 |
| 5,563,075 A * | 10/1996 | Saito et al. | ..................... | 438/87 |
| 7,126,152 B2 * | 10/2006 | Ishida et al. | .................... | 257/30 |
| 7,442,997 B2 * | 10/2008 | Zhang | ........................... | 257/390 |
| 7,825,465 B2 * | 11/2010 | Pan et al. | ....................... | 257/332 |
| 7,847,283 B2 * | 12/2010 | Zhang | ........................... | 257/30 |
| 2005/0026334 A1 * | 2/2005 | Knall | ............................ | 438/128 |
| 2005/0174828 A1 * | 8/2005 | Sharma | ........................ | 365/141 |
| 2008/0119027 A1 * | 5/2008 | Subramanian et al. | ........ | 438/380 |
| 2008/0224229 A1 * | 9/2008 | Tajima et al. | ................. | 257/379 |
| 2009/0008722 A1 * | 1/2009 | Zhang | ........................... | 257/390 |
| 2012/0014165 A1 * | 1/2012 | Kozicki | ........................ | 365/148 |
| 2012/0056146 A1 * | 3/2012 | Liu et al. | ........................... | 257/2 |

* cited by examiner

Primary Examiner — Michael Lebentritt
(74) Attorney, Agent, or Firm — IP & T Group LLP

(57) ABSTRACT

A schottky diode, a resistive memory device including the schottky diode and a method of manufacturing the same. The resistive memory device includes a semiconductor substrate including a word line, a schottky diode formed on the word line, and a storage layer formed on the schottky diode. The schottky diode includes a first semiconductor layer, a conductive layer formed on the first semiconductor layer and having a lower work function than the first semiconductor layer, and a second semiconductor layer formed on the to conductive layer.

13 Claims, 5 Drawing Sheets

SCHOTTKY DIODE, RESISTIVE MEMORY DEVICE HAVING SCHOTTKY DIODE AND METHOD OF MANUFACTURING THE SAME

CROSS-REFERENCES TO RELATED APPLICATION

The present application claims priority under 35 U.S.C. 119(a) to Korean application number 10-2011-0052435, filed on May 31, 2011, in the Korean Patent Office, which is incorporated by reference in its entirety as if set forth in full.

BACKGROUND OF THE INVENTION

1. Technical Field

Exemplary embodiments of the present invention relate to a resistive memory device and method of manufacturing the same, and more particularly, to a schottky diode capable of ensuring ON and OFF current characteristics, a resistive memory device having the schottky diode, and a method of manufacturing the same.

2. Related Art

Generally, resistive memory devices such as phase-change memory devices use a switching device to selectively apply a voltage or current to a resistive medium. Vertical type diodes having a relatively small unit area have been used as the switching device.

With exponential increase in integration density of semiconductor memory devices, a critical dimension (CD) of the switching device is reduced below exposure limits. However, when the CD and area of the switching device are reduced, a contact area between the switching device and a word line is reduced and thus ON current of a memory cell is reduced.

In order to overcome reduction in the ON current, schottky diodes having a low threshold voltage have been used instead of conventional PN diodes.

The schottky diodes are formed by depositing a polysilicon layer on a metal word line and ion implanting impurities such as boron (B) into the polysilicon layer.

Such a schottky diode has a superior ON current characteristic to conventional PN diodes. However, boron penetration is caused during a process of diffusing the impurities such B and thus OFF current characteristics of a memory cell are degraded.

SUMMARY

According to one aspect of an exemplary embodiment, a schottky diode includes a first semiconductor layer, a conductive layer formed on the first semiconductor layer and having a lower work function than the first semiconductor layer, and a second semiconductor layer formed on the conductive layer.

According to another aspect of an exemplary embodiment, a resistive memory device includes a semiconductor substrate including a word line, a schottky diode formed on the word line, and a storage layer formed on the schottky diode. The schottky diode includes a first semiconductor layer, a conductive layer formed on the first semiconductor layer and having a lower work function than the first semiconductor layer, and a second semiconductor layer formed on the conductive layer.

According to still another aspect of an exemplary embodiment, a method of manufacturing a resistive memory device includes forming a first semiconductor layer on a semiconductor substrate, patterning the first semiconductor layer in a pillar shape, forming an interlayer insulating layer surrounding the first semiconductor layer, forming a groove by partially removing the first semiconductor layer, forming a conductive layer having a lower work function than the first semiconductor layer, wherein the conductive layer is formed within the groove, forming a second semiconductor layer on the conductive layer, and forming a storage layer on the second semiconductor layer.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENT

Figure 1:
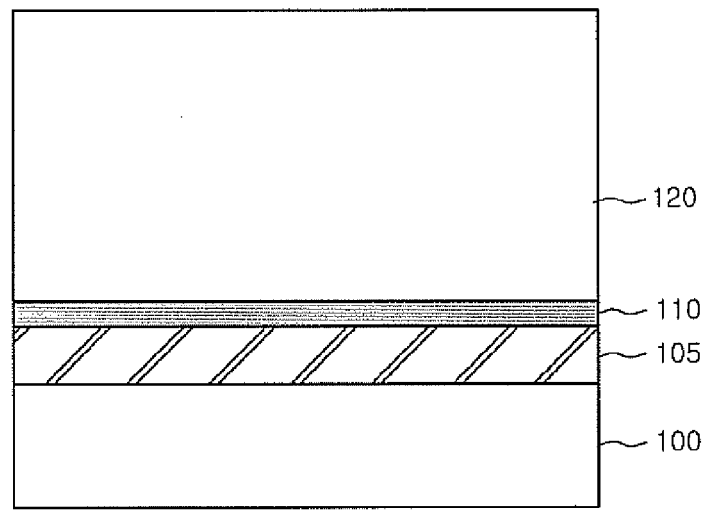
FIGS. 1 to 5 are cross-sectional views illustrating a method of manufacturing a resistive memory device according to an exemplary embodiment of the inventive concept.

Hereinafter, exemplary embodiments will be described in greater detail with reference to the accompanying drawings.

Exemplary embodiments are described herein with reference to cross-sectional illustrations that are schematic illustrations of to exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Referring to FIG. 1, a metal layer for a word line is formed on a semiconductor substrate 100 and patterned in a line shape, thereby forming a word line 105. The metal layer for a word line may be formed of one layer selected from the group consisting of a titanium (Ti) layer, a tungsten (W) layer, and a cobalt (Co) layer. In addition, the metal layer for a word line may be formed, for example, by one method selected from the group consisting of a sputtering method, a metal organic atomic layer deposition (MOALD) method, a physical vapor deposition (PVD) method, and a chemical vapor deposition (CVD) method.

A barrier metal layer 110 and, a first semiconductor layer 115 are formed on the semiconductor substrate 100 in which the word line 105 is formed. The first semiconductor layer 115 may include any one selected from the group consisting of a silicon layer, an amorphous silicon layer, and a polysilicon layer. The silicon layer, the amorphous silicon layer and the poly silicon layer may have their intrinsic states, respectively. The first semiconductor layer 115 may be formed by a low pressure chemical vapor deposition (LPCVD) method, a very low pressure CVD (VLPCVD) method, a plasma enhanced CVD (PECVD) is method, an ultrahigh vacuum CVD (UHVCVD) method, a rapid thermal CVD (RTCVD) method, or an atmosphere pressure CVD (APCVD) method.

At this time, the first semiconductor layer 115 may be deposited at a temperature ranging from 400 to 800° C. Alternatively, an interface treatment may be performed at a temperature ranging from 200 to 600° C. before the first semiconductor layer 115 is deposited.

Figure 2:
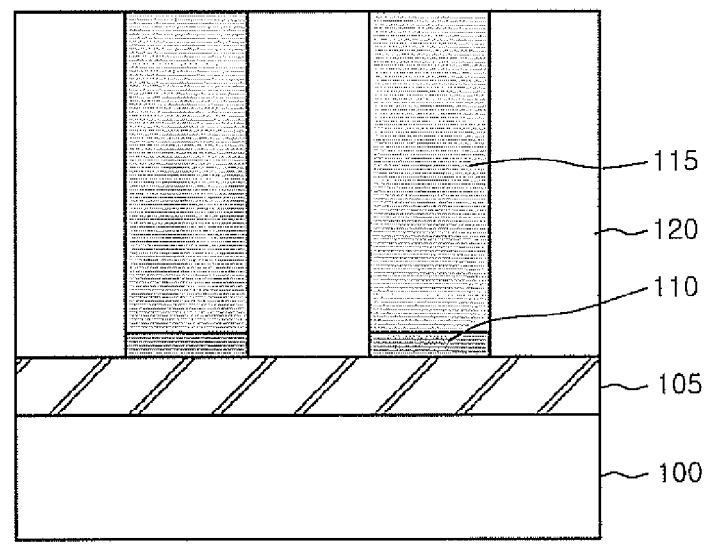

Referring to FIG. 2, the first semiconductor layer 115 and the barrier metal layer 110 are patterned in a pillar shape to remain in a diode formation region. At this time, the pillar-shaped first semiconductor layer 115 becomes a portion of the schottky diode by an electrical contact with the word line 105. The first semiconductor layer 115 may be patterned using a double photo process to have a fine critical dimension (CD). Next, an interlayer insulating layer 120 is gap-filled on either side of the pillar-shaped first semiconductor layer 115. The interlayer insulating layer 120 may be formed so that an upper surface of the interlayer insulating layer 120 has the same surface level as an upper surface of the first semiconductor layer 115. The interlayer insulating layer 120 may be formed of a silicon oxide layer or a silicon nitride layer.

Figure 3:
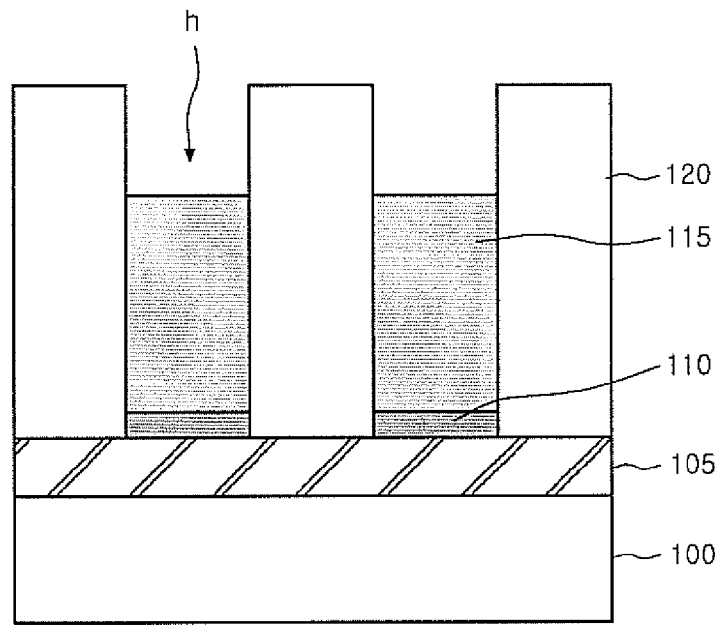

Referring to FIG. 3, the first semiconductor layer 115 is removed by a desired thickness to form a groove h. The first semiconductor layer 115 may be removed by the desired thickness by dipping out in an etchant. As an etchant for partially removing the first semiconductor layer 115, an etchant containing nitrogen and ammonia may be used. The removed first semiconductor layer 115 in thickness may correspond to 10 to 90% of the total thickness of the first semiconductor layer 115.

Figure 4:
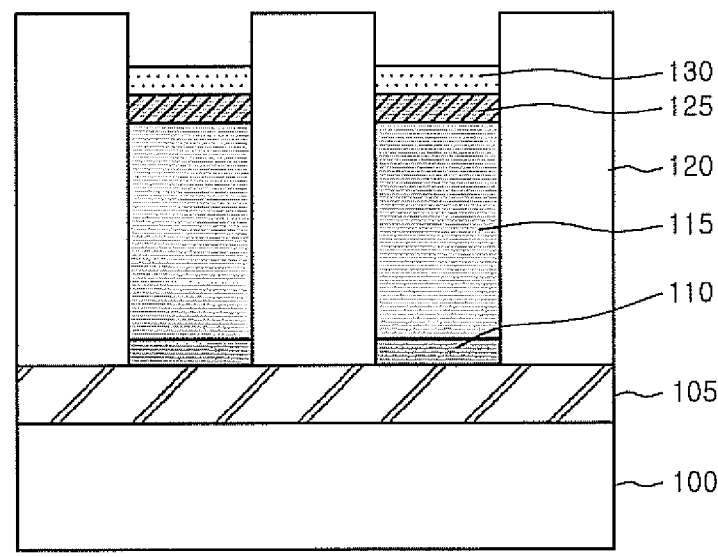

Referring to FIG. 4, a conductive layer 125 and a second semiconductor layer 130 are stacked on the first semiconductor layer 115 in the groove h to form a schottky diode 115, 125 and 130 in a space surrounded by the interlayer insulating layer 120.

At this time, the conductive layer 125 is a material layer for increasing an energy level of the first semiconductor layer 115 and may include a material layer having a lower work function than the first semiconductor layer 115. For example, as the conductive layer 125 may include a silicon germanium (SiGe) layer formed by a selective method. Here, an energy level of germanium (Ge) is well known to be lower than an energy level (1.17 eV) of silicon (Si). Therefore, when content of Ge is increased in Si, Si has an energy level closer to metal. Thus, a threshold voltage of the schottky diode can be reduced. For example, when the content of Ge is about 50% in SiGe, the energy level of SiGe becomes 0.78 eV.

Thus, when the SiGe layer having a higher energy level than Si is stacked on the first semiconductor layer 115 as the conductive layer 125, the threshold voltage of the schottky diode including the first semiconductor layer 115 as a main component is dropped and thus ON current thereof can increase.

In the exemplary embodiment, the content of Ge in the SiGe layer used as the conductive layer 125 may be in a range of 5 to 50%. Alternatively, the conductive layer 125 formed of SiGe may have an amorphous state or a polycrystalline state. The conductive layer 125 formed of SiGe may be selectively formed by a simultaneous injection of a deposition gas and an etching gas. At this time, deposition selectivity of the conductive layer 125 formed of SiGe to the first semiconductor layer 115 may be controlled by a hydrochloric (HCl) gas provided as the deposition or etching gas. However, the illustrated method of forming the conductive layer 125 is exemplary only, and any method of selectively forming the conductive layer 125 on the first semiconductor layer 115 may be used.

The second semiconductor layer 130 is a material layer for improving conduction characteristics of the schottky diode. For example, the second semiconductor layer 130 may be an impurity-doped polysilicon layer. As impurity, a p-type impurity such as B, or an n-type impurity such as phosphorous (P) or arsenic (As) may be used. An impurity concentration in the second semiconductor layer 130 may be about $10^{16}$ to $10^{22}$ atoms/cc.

In the exemplary embodiment, the second semiconductor layer 130 may be a silicon layer containing B and the silicon layer constituting the second semiconductor layer 130 may have an amorphous state or a polysilicon state. The second semiconductor layer 130 may be deposited with doping impurities, thereby preventing the impurities from penetration due to ion implantation. In addition, even when the impurities in the second semiconductor layer 130 are diffused, the conductive layer 125 is disposed below the second semiconductor layer 130 so that the conductive layer 125 can block diffusion of the impurities to the first semiconductor layer 115.

The conductive layer 125 and the second semiconductor layer 130 are silicon-based layers and thus the conductive layer 125 and the second semiconductor layer 130 are formed in situ. Alternatively, in some cases, an interface treatment process for removing a native oxide layer may be additionally performed between the process of forming the conductive layer 125 and the process of forming the second semiconductor layer 130.

At this time, the conductive layer 125 and the semiconductor layer 130 are formed to be positioned lower than a depth (or thickness) of the groove h, so that the groove h remains between the interlayer insulating layers 135.

Figure 5:
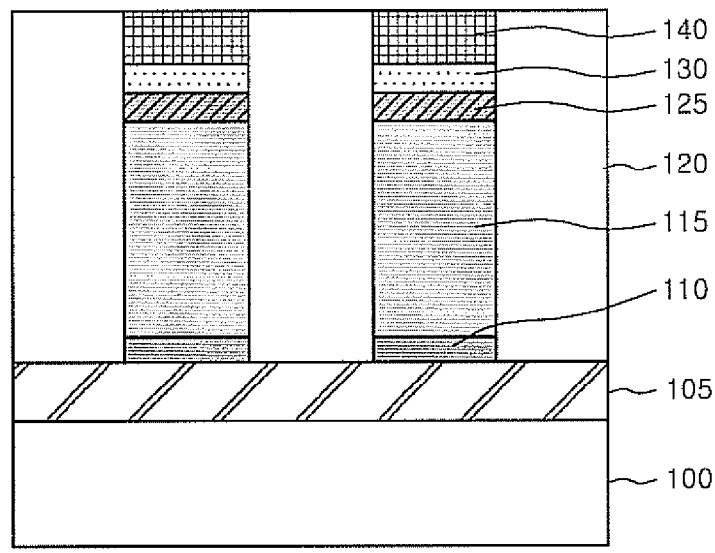

Referring to FIG. 5, a storage layer 140 is buried in the remaining groove h. Here, the storage layer 140 is a material layer in which a memory operation may be substantially performed. For example, the storage layer 140 may be a resistive layer or a phase-change layer.

Figure 6:
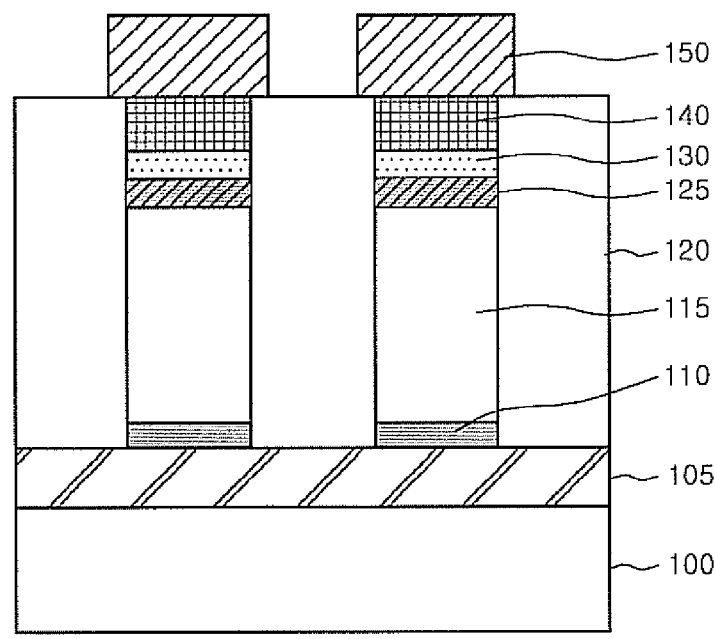
FIGS. 6 to 10 are cross-sectional views illustrating resistive memory devices according to another exemplary embodiment of the inventive concept.

Referring to FIG. 6, an upper electrode 150 is formed on the storage layer 140 by a conventional process.

According to the exemplary embodiment, the conductive layer formed of SiGe is interposed within the silicon diode constituting the schottky diode. Thus, the threshold voltage of the schottky diode can be lowered and ON current of the schottky diode can increase.

The conductive layer having a different property such as SiGe is positioned within the material layer constituting the schottky diode to block downward diffusion or penetration of the impurities such as B. Thus, occurrence of OFF current can be reduced.

Figure 7:
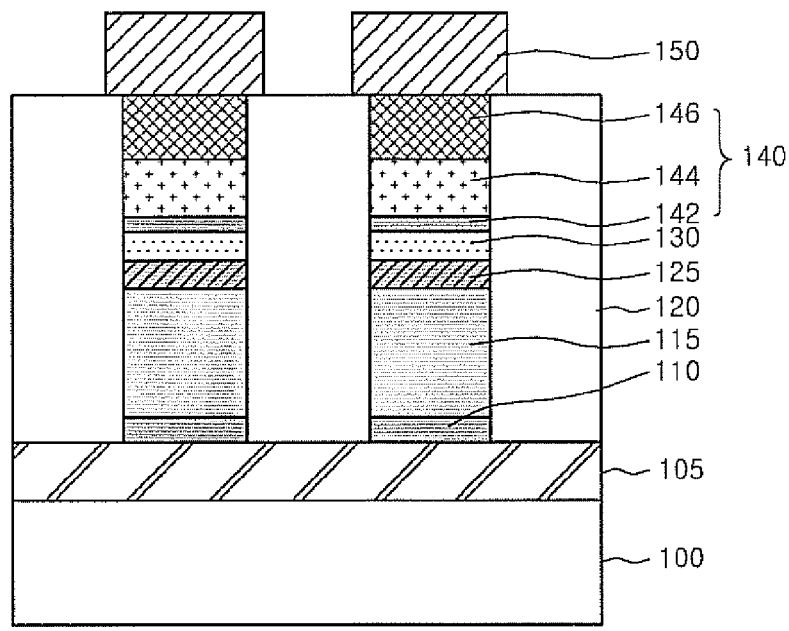

FIG. 7 is a cross-sectional view of a semiconductor memory device according to another exemplary embodiment.

Referring to FIG. 7, a storage layer 140 may include a stacked layer of an upper barrier metal layer 142, a heating electrode 144, and a phase-change material layer 146.

The upper barrier metal layer 142 is formed on the second semiconductor layer 130 to improve contact characteristics between the heating electrode 144 and the silicon-based second semiconductor layer 130. The upper barrier metal layer 142 may be formed of the same material as the lower barrier metal layer 110.

The heating electrode 144 receives a current provided from the schottky diode to heat the phase-change material layer 146 stacked thereon, thereby obtaining a phase-change.

An upper electrode 150 is formed on the phase-change material layer 146. The upper electrode 150 may be a bit line.

Figure 8:
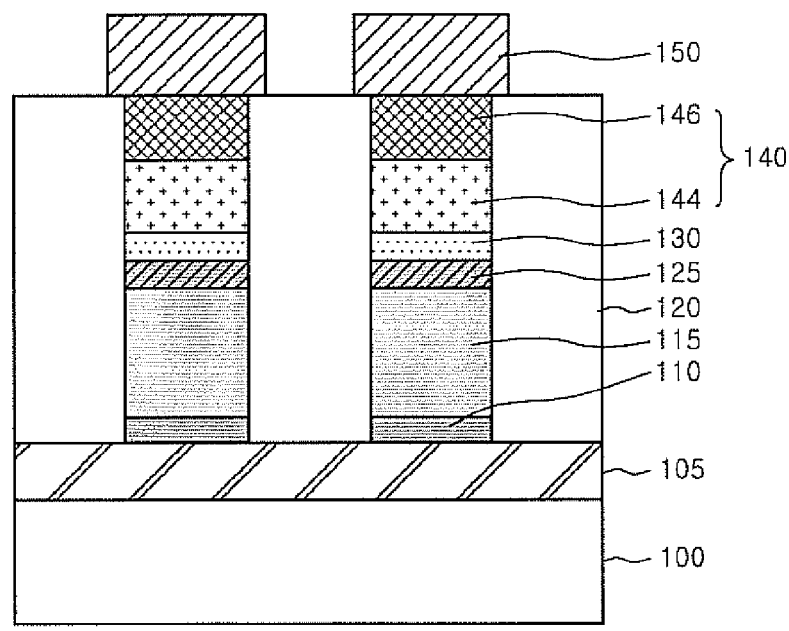

In addition, as shown in FIG. 8, a heating electrode 144 may be directly deposited on the second semiconductor layer 130. In this case, the heating electrode 144 may include a silicon-based material such as polysilicon or SiGe, similar to the second semiconductor layer 130.

Figure 9:
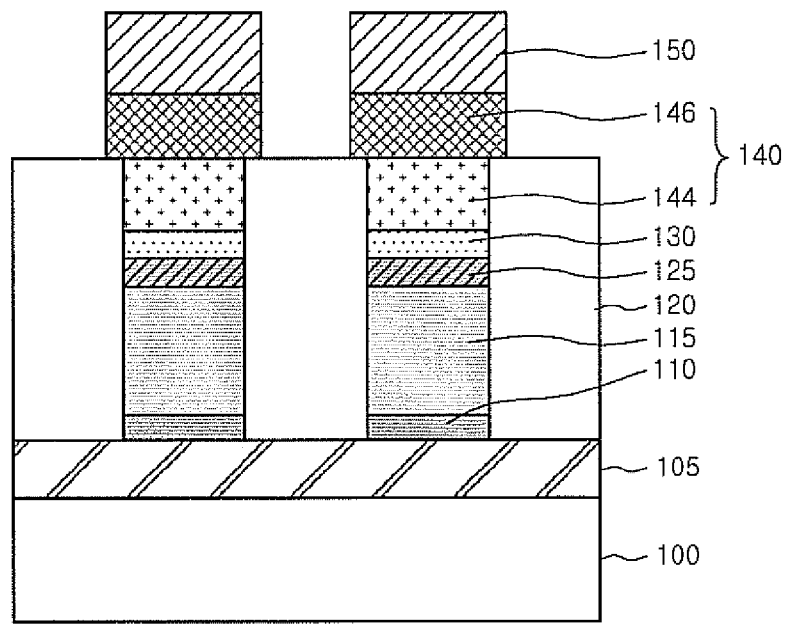

In addition, as shown in FIG. 9, according to an example, only a heating electrode 144 may be formed in the groove h and a phase-change material layer 146 and an upper electrode 150 are sequentially formed on the heating electrode 144 and the interlayer insulating layer 120. In this case, a barrier metal layer may be interposed between the heating electrode 144 and the second semiconductor layer 130 according to the property of the heating electrode 144.

Figure 10:
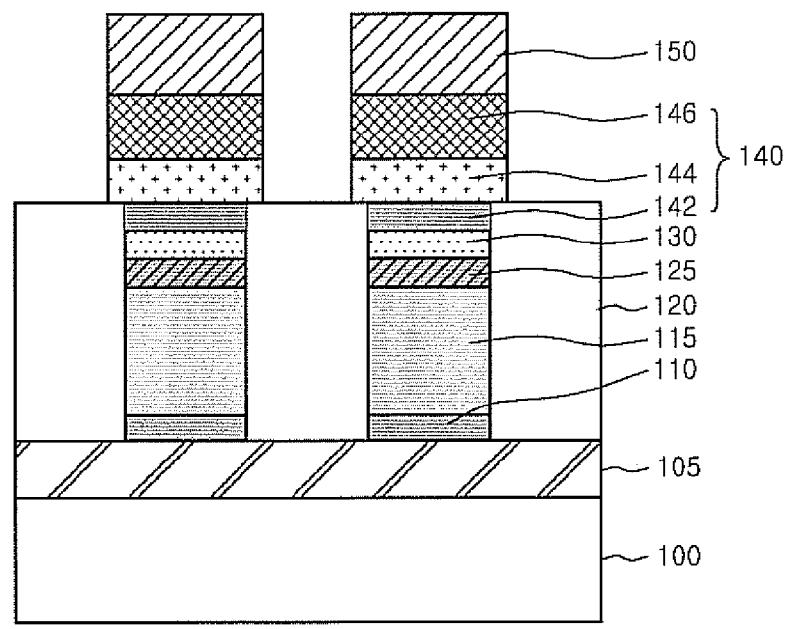

In addition, as shown in FIG. 10, according to an example, only an upper barrier metal layer 142 is buried in the groove h and a heating electrode 144, a phase-change material layer 146, and an upper electrode 150 may be sequentially stacked on the upper barrier metal layer 142.

As described above in detail, according to the exemplary embodiment of the inventive concept, a material having a lower work function than a semiconductor layer is interposed within the semiconductor layer constituting the schottky diode to reduce the threshold voltage of the schottky diode. Thus, ON current of the schottky diode can increase.

In addition, the material layer is formed within the semiconductor layer constituting the schottky diode to prevent the impurities from downward diffusion or penetration and thus, OFF current of the schottky diode can be reduced.

While certain embodiments have been described above, it will be understood that the embodiments described are by way of example only. Accordingly, the devices and methods described herein should not be limited based on the described embodiments. Rather, the systems and methods described herein should include any other embodiments consistent with features of the present invention.

What is claimed is:

1. A schottky diode, comprising:
   a first semiconductor layer;
   a conductive layer formed on the first semiconductor layer and having a lower work function than the first semiconductor layer; and
   a second semiconductor layer formed on the conductive layer.

2. The schottky diode of claim 1, wherein the first semiconductor layer includes a silicon (Si)-containing amorphous layer or a Si-containing poly layer.

3. The schottky diode of claim 1, wherein the second semiconductor layer includes a Si-containing amorphous layer doped with impurities or a Si-containing poly layer doped with impurities.

4. The schottky diode of claim 1, wherein the conductive layer includes a silicon germanium (SiGe) layer.

5. A resistive memory device, comprising:
   a semiconductor substrate including a word line;
   a schottky diode formed on the word line; and
   a storage layer formed on the schottky diode,
   wherein the schottky diode includes:
   a first semiconductor layer;
   a conductive layer formed on the first semiconductor layer and having a lower work function than the first semiconductor layer; and
   a second semiconductor layer formed on the conductive layer.

6. The resistive memory device of claim 5, wherein the first semiconductor layer includes a silicon (Si)-containing amorphous layer or a Si-containing poly layer.

7. The resistive memory device of claim 5, wherein the semiconductor layer includes a Si-containing amorphous layer doped with impurities or a Si-containing poly layer doped with impurities.

8. The resistive memory device of claim 5, wherein the conductive layer includes a silicon germanium (SiGe) layer.

9. The resistive memory device of claim 5, further comprising a lower barrier metal layer disposed between the word line and the schottky diode.

10. The resistive memory device of claim 5, wherein the storage layer includes:
    a heating electrode disposed on the schottky diode; and
    a phase-change material layer disposed on the heating electrode.

11. The resistive memory device of claim 10, further comprising a barrier metal layer disposed between the schottky diode and the heating electrode.

12. The resistive memory device of claim 5, wherein the schottky diode includes a plurality of pillar structures and the storage layer is stacked on the schottky diode and surrounded by an interlayer insulating layer.

13. The resistive memory device of claim 5, comprising an upper electrode formed on the storage layer.

* * * * *